United States Patent [19]

Cox et al.

[11] Patent Number: 4,605,894
[45] Date of Patent: Aug. 12, 1986

[54] HIGH DENSITY TEST HEAD

[75] Inventors: Gerald Cox, Fremont; Bill DeHaven, Los Altos, both of Calif.

[73] Assignee: GenRad Semiconductor Test, Inc., Milpitas, Calif.

[21] Appl. No.: 527,214

[22] Filed: Aug. 29, 1983

[51] Int. Cl.[4] .................. G01R 31/26; G01R 1/02; G01R 17/02
[52] U.S. Cl. ........................... 324/73 R; 324/158 F
[58] Field of Search ............ 324/73 R, 73 AT, 158 F, 324/73 PC; 371/20; 364/481

[56] References Cited

U.S. PATENT DOCUMENTS

| | | | |
|---|---|---|---|
| 3,423,677 | 1/1969 | Alford et al. | 324/73 R |
| 3,622,876 | 11/1971 | Ure | 324/73 R |
| 4,092,589 | 5/1978 | Chau et al. | 324/73 R |
| 4,354,268 | 10/1982 | Michel et al. | 324/73 R X |
| 4,399,405 | 8/1983 | Welzhofer | 324/73 AT |
| 4,472,678 | 9/1984 | Lauriello | 324/73 R |
| 4,517,512 | 5/1985 | Petrich et al. | 324/73 R |
| 4,523,312 | 6/1985 | Takeuchi | 324/73 R X |

Primary Examiner—Stewart J. Levy
Assistant Examiner—Stephen M. Baker
Attorney, Agent, or Firm—Limbach, Limbach & Sutton

[57] ABSTRACT

An improved automatic test equipment system for testing electronic assemblies wherein such system includes a main cabinet and a test head. Driver and load circuits are partitioned between the test head and main cabinet so that high power dissipating portions of the load circuit and drive circuit are located in the main cabinet and the low power dissipating portions of the load circuit and drive circuit are positioned in the test head. Disclosed is a structure by which the partitioning of the driver and load circuits can be achieved, the structure including a transmission line and a current buffer which permit the transmission of current pulses over long distances without degradation in the current pulse shape. The structure utilizes a common base current buffer stage with collector base clamping.

12 Claims, 9 Drawing Figures

Fig. 5a.
(PRIOR ART)
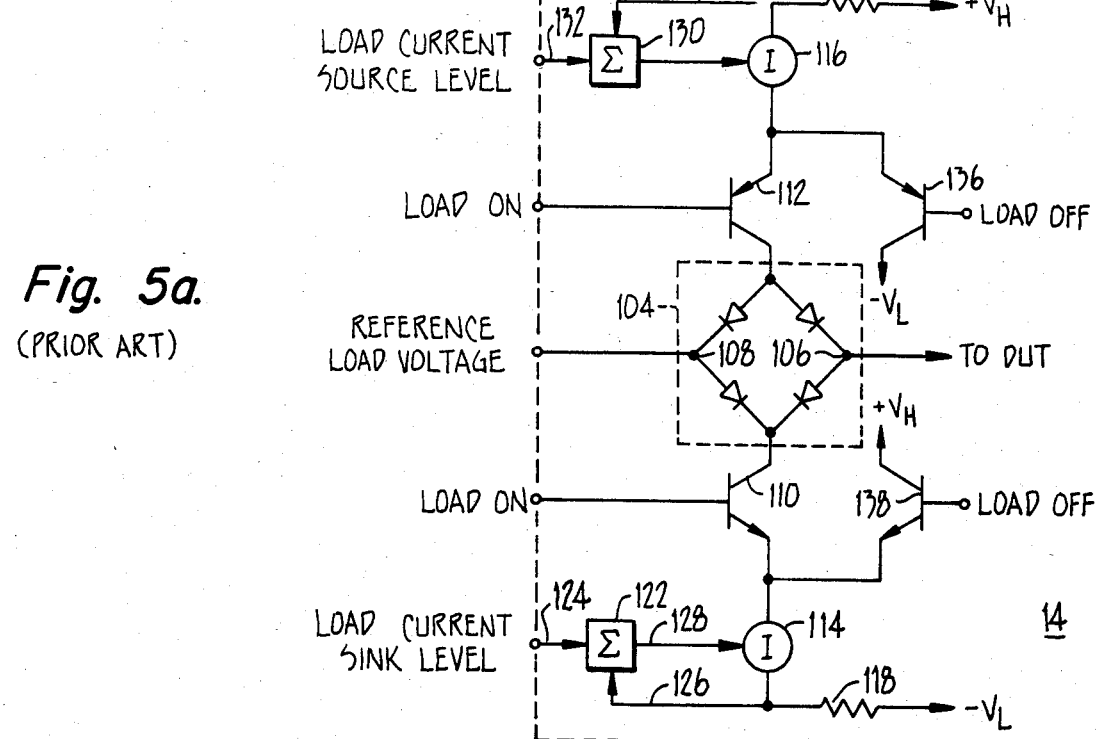
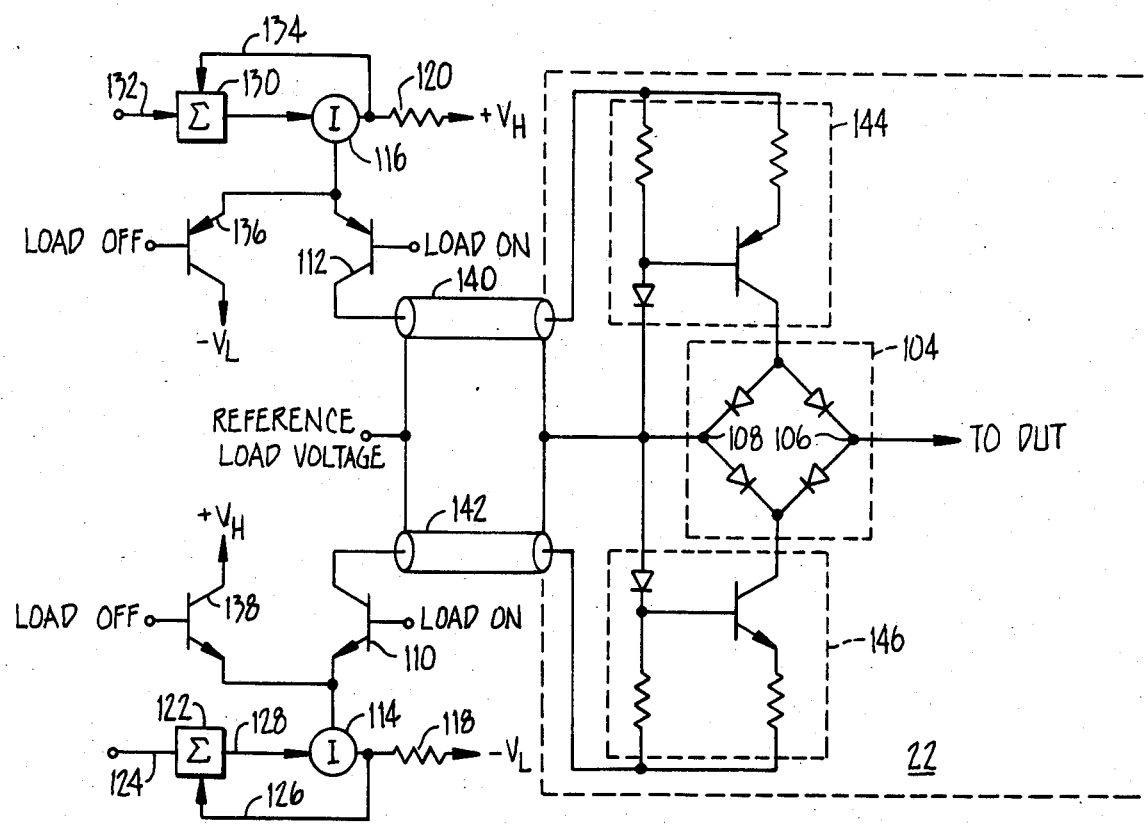
Fig. 5b.

HIGH DENSITY TEST HEAD

DESCRIPTION

1. Technical Field

The present invention is directed in general to automatic test equipment and, more particularly, to automatic test equipment having a novel arrangement of driver and load circuitry so that a high density test head is obtained.

2. Background Art

Test heads are appendages in automatic test equipment (ATE) which permit the input and output (I/O) circuits of the head to be physically manipulated into proximity to the electronic assemblies to be tested. These assemblies include very large scale (VLSI) arrays mounted in array handlers or wafer probers.

These assemblies, referred to as the device under test (DUT), can have more than 200 pins or test points, with each point being an input or an output to the DUT. The test points or pins of the DUT are connected, by way of test pins in the test head, to circuitry in the ATE which provide test signals to, apply loads to, and monitor and evaluate response signals from the DUT.

Typically, the test signals are supplied by driver circuits, the loads are implemented by load circuits, and the monitoring and evaluation of response signals are performed by comparator circuitry. The circuits are under program control by a controller or central processing unit within the ATE. Reference is made to U.S. Pat. Nos. 3,423,677 to J. H. Alford et al., 3,546,582 to J. D. Barnard et al., 3,597,682 to J. C. Hubbs, and 3,622,876 to G. R. Ute, wherein typical ATE are discussed.

The test head configuration for prior art ATE generally implements the philosophy that best ATE performance can be obtained by positioning the circuitry for the driver, load and comparator functions in close proximity to the DUT. However, it has been discovered that the very positioning of the circuits in close proximity to the DUT is a significant cause of the limited performance of the test head.

In presently existing ATE, the hardware which implements the above-discussed circuitry reside wholly within the test head, along with a plurality of relays for providing selectable connections between the DUT and said circuitry. Each test pin of the test head has its own driver, load and comparator circuitry.

These driver and load circuits generate a substantial amount of heat. As such, heat dissipation means such as a forced air cooling system, are often required. Additionally, the heat generated in the test head dictates that a minimum spacing be maintained between components to provide a safe operating environment for the components.

As a result, test heads of the prior art are large in physical size and have large spacings between test pins. This large test pin spacing, in turn, dictates that the connections between individual test pins and the pins and test points of the DUT be of significant electrical length. The shunt capacitance of these long connections results in an upper limit on the speed at which the test head is capable of operating and thus degrades the performance of the ATE. The same shunt capacitance, whether treated as a lumped capacitance or as a distributed capacitance in a transmission line, cannot be appropriately driven, at speed, by certain DUT types.

It has been discovered that if the circuits are partitioned, with certain portions of the circuits being positioned within the main cabinet of the ATE and the remainder of the circuit portions being positioned in the test head, that a substantial improvement in the performance of the test head and the ATE can be realized.

DESCRIPTION OF THE INVENTION

The foregoing and other problems of prior art automatic test equipment and test heads are overcome by the present invention of a method and an apparatus for testing electronic assemblies having a test head for supporting an electronic assembly under test and a main cabinet, wherein the apparatus supplies test signals to, applies loads to, and receives response signals from the electronic assembly under test. The apparatus includes driver means for supplying the test signals to the electronic assembly under test. The driver means are organized into a first portion which is positioned in the main cabinet and a second portion which is positioned in the test head. The first portion includes those elements of the driver means which consume a substantial proportion of the total power consumed by the driver means. The second portion of the driver means includes the remaining elements of the driver means. Also included are load means for supplying the loads to the electronic assembly under test. The load means are also partitioned and distributed between the test head and the main cabinet to place the high power-dissipating circuit portions into the main cabinet and the remaining portions into the test head. Comparison means are provided in the test head for receiving and evaluating the response signals. Control means are positioned in the main cabinet and coupled to the comparison means, to the driver means and to the load means for controlling the operation of said means. Also provided are first means for coupling the comparison means, driver means and load means to the electronic assembly under test.

In a preferred embodiment of the present invention, the driver and load means each include a current source and voltage reference which are located in the main cabinet. The current source and voltage reference provide a test current and a test voltage, respectively, to current diverter means in the test head. The signals are coupled to the current diverter in the test head via a transmission line and current buffer means. The output of the current diverter is connected to the electronic assembly under test via the first coupling means. The current diverter supplies to or diverts current from the electronic assembly under test so as to maintain the point of connection to the electronic assembly under test at a voltage level substantially equal to the test voltage. The circuits by which the current diverter and buffer means are implemented and structured for minimal power dissipation without loss of test speed.

The relocation of the high power dissipating circuitry into the main cabinet permits a closer spacing of the pins in the test head. In turn, the length of the connections between the pins in the test head and the electronic assembly under test are reduced substantially. This causes a reduction in shunt capacity which makes possible higher testing speed. Additionally, the combination of transmission line and current buffer utilized in the present invention also provides for a higher test speed. As a result, a test head which is smaller, lighter, faster and cooler than test heads presently available can be had.

It is therefore an object of the present invention to provide an automatic test system which provides a high density test head with high speed test signal generation capabilities.

It is another object of the present invention to provide an automatic test system wherein the driver and load circuits are partitioned into high power dissipating and low power dissipating portions and wherein the high power dissipating portions are located within a main cabinet and the low power dissipating portions are located within the test head.

It is another object of the present invention to provide an automatic test system wherein driver and load circuits are provided, and further wherein the driver and load circuitry include current and voltage sources which are located within a main cabinet, current diverter and current buffer means which are located in the test head, and transmission line means for coupling current and voltage test signals from the current voltage sources to the current buffer and diverter means in the test head.

These and other objectives, features and advantages of the present invention will be more readily understood upon consideration of the following detailed description of the invention and accompanying drawings.

BRIEF DESCRIPTION OF THE DRAWINGS

FIGS. 5a and 5b contrast load circuitry of prior test heads with the load circuitry of the present invention.

DETAILED DESCRIPTION OF THE INVENTION

Figure 1A:
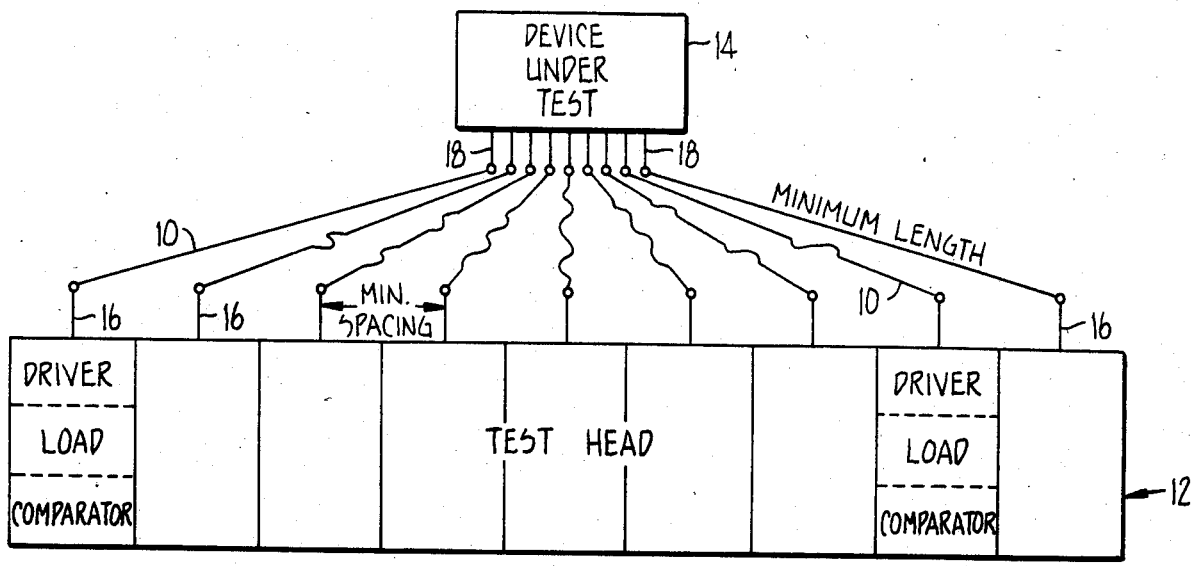
FIG. 1a is a graphic illustration of the pin-spacing and interconnection limitations of prior test heads.

FIG. 1a illustrates the effect of test pin spacing in the test head upon the length of the connections between the test head and the device under test (DUT) 14. Typically, the spacing between test pins 16 and the test head 10 is substantially greater than the spacing between the pins 18 of the device under test 14. As such, the lengths of the connections 10 between test head 12 and DUT 14 are substantial and result in significant shunt capacitance. Because of this large test pin spacing, a circular arrangement with such pin spacing would result in a physically large head. Thus, a grid-like arrangement of the test pins 10 on the test head is typically utilized.

Figure 1B:
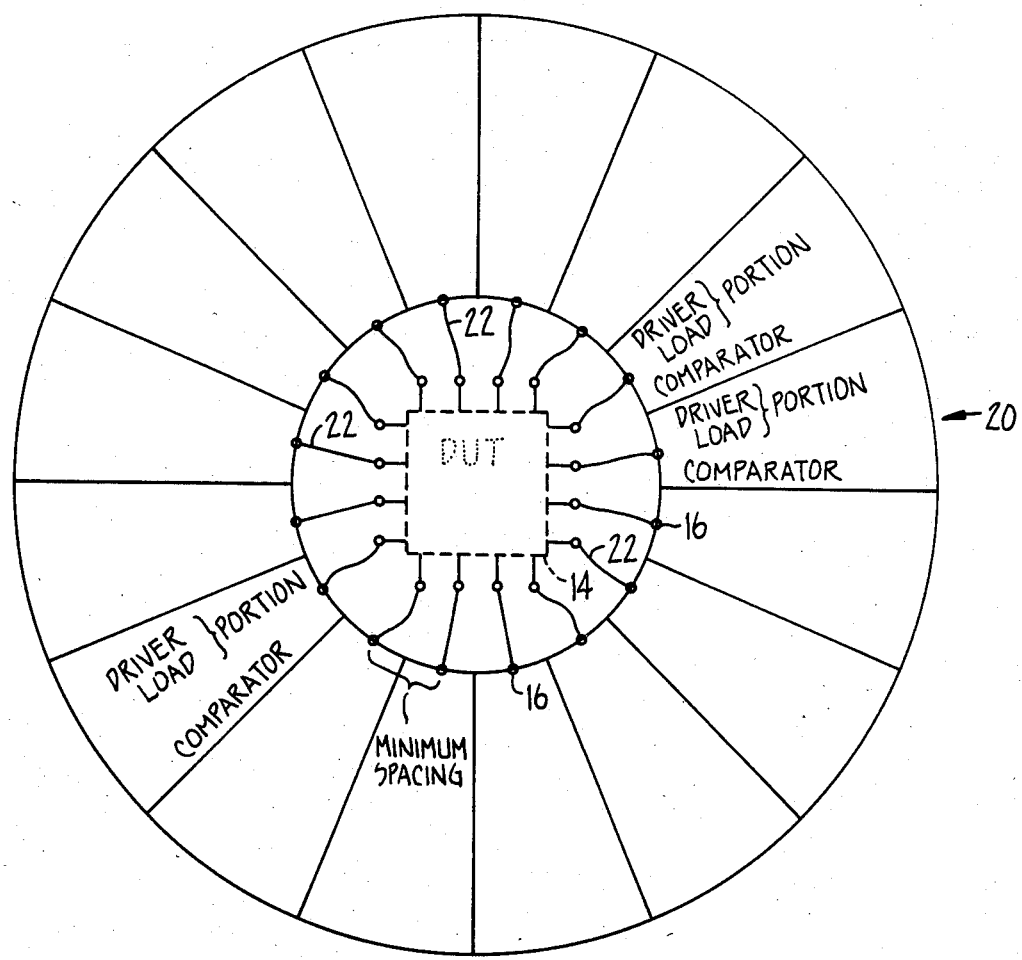
FIG. 1b illustrates the reduced pin-spacing available under the present invention and resulting reduction in connection length.

Conversely, in the present invention, FIG. 1b, because shorter test pin spacings are provided, a circular arrangement of test pin 18 on a test head 20 can be realized. In turn, the length of the connections 22 between the device under test 14 and the test pin 18 can be minimized and the placement of circuitry associated with each test pin can be achieved using a simple radial format.

Figure 2A:
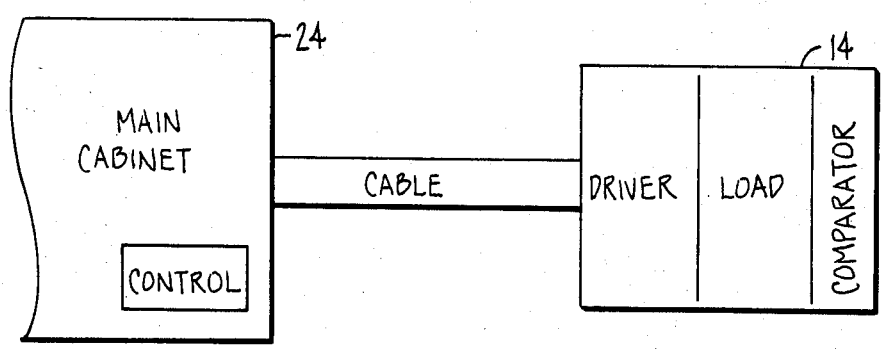
FIGS. 2a and 2b contrast the circuit positioning philosophy of prior automatic test equipment drive and load circuitry with the distributive approach of the present invention.
Figure 2B:
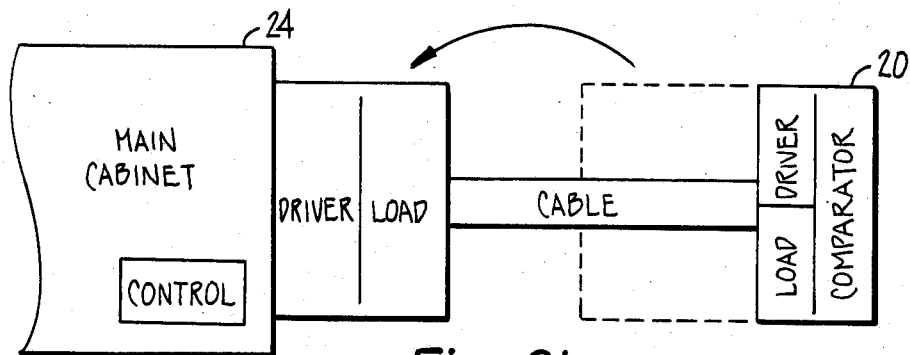

Referring to FIG. 2, it can be seen that, in the past, all of the circuitry for the driver and load functions of the ATE were positioned within the test head 14. In contrast, the present invention divides the circuitry of the driver and load functions among the test head 14 and the main cabinet 24.

Figure 3:
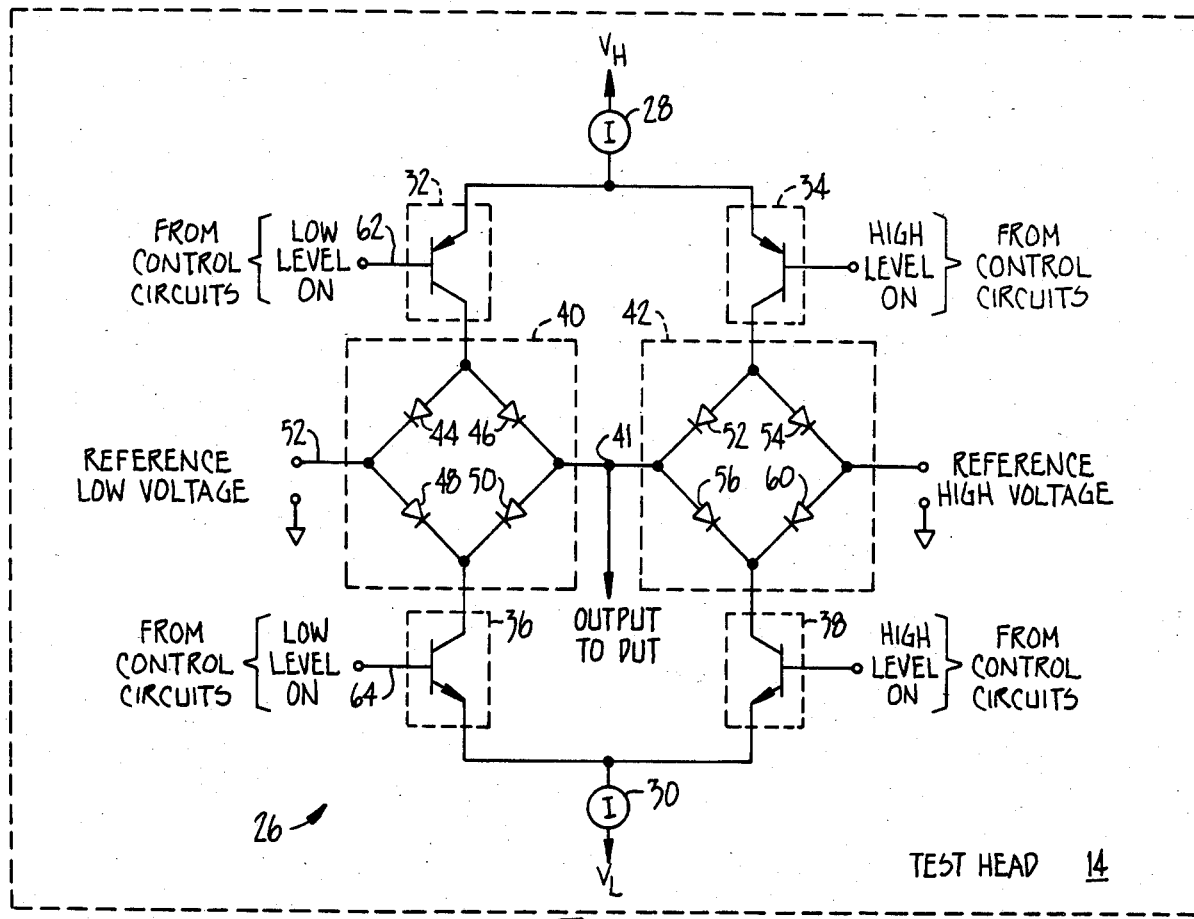
FIG. 3 illustrates the driver circuitry location in prior test heads.

FIG. 3 illustrates typical drive circuitry 26 for a test pin in prior ATE. All of the circuitry are located in the test head. This circuitry includes current sources 28 and 30, current switches 32, 34, 36 and 38, and current diverters 40 and 42. Current switches 32 and 36 are activated in common as are current switches 34 and 38. In order to simplify the explanation of the driver means, the current switches 32, 34, 36 and 38 in FIG. 3 have been substantially simplified in view of the circuitry actually required. The circuitry which has been deleted would include biasing networks, bypassing and filtering.

Current source 28 is referenced to a positive voltage level $V_H$ while current source 30 is referenced to a negative voltage level $V_L$. The current from current source 28 flows through current switches 32 and 34 into current diverters 40 and 42, respectively. Conversely, the current source 30 provides a current sink for current flowing out of current diverters 40 and 42 via current switches 36 and 38, respectively.

The output of driver circuit 26 is provided at the interconnection 41 of current diverters 40 and 42.

As can be seen from FIG. 3, current diverters 40 and 42 are each diode bridges. The anodes of diodes 44 and 46 are connected together and to the output of current switch 32, while the cathodes of diodes 48 and 50 are tied together and connected to the input of current switch 36. The cathode of diode 44 is tied to the anode of diode 48 and to the low reference voltage input 52, while the cathode of diode 46 and the anode of diode 50 are tied together and to the output. In a similar manner, diodes 52, 54, 56 and 60 are interconnected and connected to the current switches 34 and 36, to the output, and to the high reference voltage input.

In operation, current diverters 40 direct current to or away from the output to maintain the voltage level at the output at a level substantially equal to the low reference voltage level, when an activating signal is applied to control input 62 of current switch 32 and control input 64 of current switch 36.

When the output is at a level higher than the low reference voltage, diodes 46 and 48 are reversed biased and therefore non-conductive, while diodes 44 and 50 are forward biased and therefore conductive. As such, current flows from current source 28 through current switch 32 and diode 44 into the reference line 52, and current flows from the output through diode 50, current switch 38 and into current sink 30.

If, on the other hand, the output voltage level is below the low reference voltage level, diodes 50 and 44 are reversed biased and non-conductive, while diodes 46 and 48 are forward biased and, therefore, conductive. As such, current from current source 28 flows to current switch 32, diode 46, and into the output. Similarly, current flows from the low reference voltage line 52 through diode 48 into current switch 36 and into current source 30. When the output is substantially equal to the low reference voltage, all diodes 44, 46, 48 and 50 conduct with the current flow in any one diode being determined by the amount of current flowing into or out of the output.

The current diverters 40 and 42 thus divert current to or from the output depending upon the voltage level of the output with respect to the reference level supplied to the diverter. For the current diverter 42, a similar operation is provided but is referenced to the high reference voltage level. In the above manner, a test signal having precise high and low voltage excursions at current-limited levels can be generated. The current switches 34 and 38 are operated during the high level portions of the waveform and current switches 32 and 36 are generated during the low level portions of the waveform.

In the above-discussed prior art driver, the current switches 32, 34, 36 and 38 typically take the form of transistors, wherein on/off signals are applied to the base of each transistor to cause current to flow between the emitter and collector of the transistors. Additionally, because different families of semi-conductor devices are required to be accommodated by the ATE, the voltage levels of $V_H$ and $V_L$ are required to be large enough to cover the entire range of device family voltages. As such, a substantial amount of the supply voltage $V_H$ and $V_L$ is dropped across the collector-emitter junction of the transistors in current switches 32, 34, 36 and 38. This results in a substantial amount of power being dissipated in these transistors, and thus a substantial amount of power dissipated within the test head.

Figure 4:
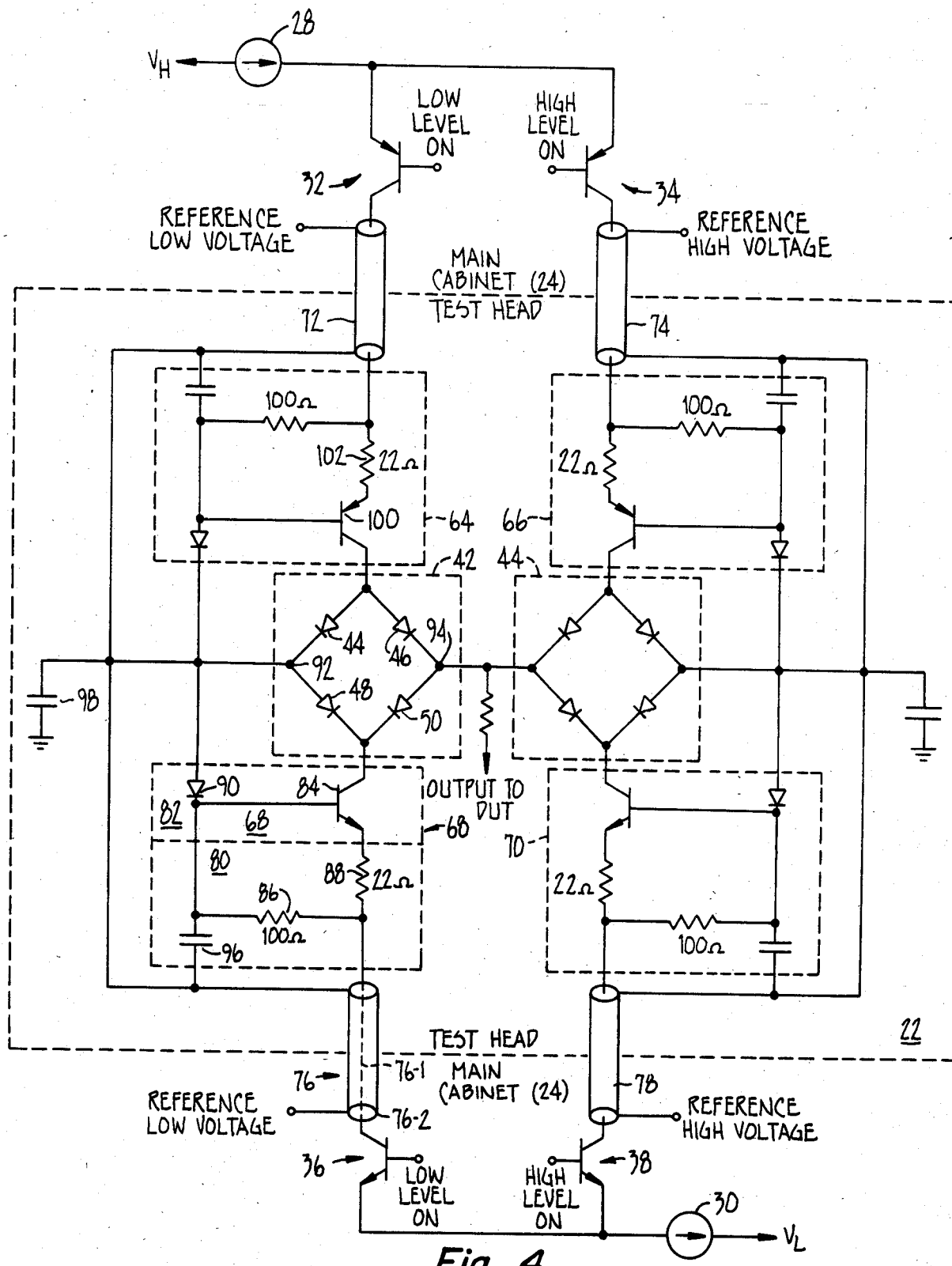
FIG. 4 illustrates the driver circuitry of the present invention.

It has been discovered that the prior art driver circuitry can be partitioned into high power and low power consumption portions, and that these portions can be separated by appropriate transmission line and buffering circuits without any degradation in the performance of the circuits. By partitioning the circuitry, the high power dissipating portions of the circuit can be moved into the main cabinet where heat generation is not as significant a problem as in the test head. With a reduction in the heat generated in the test head, the spacing between components and therefore between test pins of the test head can be reduced, thereby providing a higher density test head. FIG. 4 illustrates this partitioning.

As can be seen from FIG. 4, the current diverters 42 and 44 of the prior driver circuitry are retained in the test head, while the current source and sinks 28 and 30, respectively, along with the current switches 32, 34, 36 and 38 have been moved to the main cabinet.

In order to couple the current diverters to the current switches, current buffer means 64, 66, 68, and 70 are provided. Additionally, transmission lines 72, 74, 76 and 78 provide the coupling between the test head and the main cabinet.

It is to be understood that driver circuitry, such as that shown in FIG. 4, is provided for each test pin in test head 14.

The operation of current buffer 68 and transmission line 76 will now be explained in greater detail, it being understood that the other current buffers and transmission lines in the circuit shown in FIG. 4 operate in a similar manner.

Current buffer 68 includes a resistive matching network 80, and an amplification stage 82 which is connected in a common base configuration. Amplification stage 82 includes a clamp which prevents the stage from going into saturation.

Matching network 80 is intended to match the characteristic impedance $Z_0$ of transmission line 76 to the impedance of amplification stage 82. In the embodiment shown in FIG. 4, the matching network 80 includes an "L" resistive pair, resistors 86 and 88, together. The junction of resistors 86 and 88 are connected to the transmission line 76, while the other end of the resistors are connected to the amplification stage 82.

In the embodiment shown in FIG. 4, the amplification stage includes a transistor 84 in which the emitter thereof is connected to the free end of resistor 88, and the base thereof is connected to the free end of resistor 86, and the clamp diode 90. The collector of transistor 84 is connected to the junction of diodes 48 and 50.

Amplification stage also includes a clamping function between the collector and emitter of transistor 84 to prevent transistor 84 from operating in the saturated mode. This clamping function is implemented via the interaction of diodes 90 and 48 with the input impedance of the common base stage 82. The anode of diode 90 is connected to the reference low voltage by way of the transmission line shield, as is the junction of diodes 48 and 44. As connected, diode 90 ensures that the voltage drop between the junction of diodes 44 and 48 and the base of transistor 84 is no greater than one diode drop. This, and the fact that current diverter 42 operates to maintain the voltage difference between node 92 and 94 at approximately zero volts, dictates that the collector of transistor 84 will be at substantially the same voltage as the base thereof, when the transistor is conducting. The base-emitter voltage corresponds to a diode drop when transistor 84 is conducting. Thus, the collector-emitter voltage of transistor 84 will be no less than a diode drop, and therefore held out of saturation, when transistor 84 is conducting. As such, transistor 84 is maintained in an active mode to optimize the speed of the transistor.

Capacitor 96 and capacitor 98 are bypass capacitors. Capacitor 98 AC couples node 92 to ground, while capacitor 96 is shown AC coupling the base of transistor 84 to node 92, and thus AC coupling the base of transistor 84 to ground. Transistor 84 is thus operated in the common base mode. In this mode, the transistor 84 acts as a current buffer; i.e., the current applied at the input (through the emitter) is substantially equal to the current out of the output (through the collector).

The emitter-base impedance of transistor 84 is low, and therefore ideal for matching, via matching network 80, to the characteristic impedance 70 of transmission line 76. When properly matched, transmission line 76 can have substantial electrical length without significant signal degradation and can be used to connect the current sources 28 and 30, as well as the current switches 32, 34, 36 and 38 to the test head. In turn, this permits the current sources and current switches to be located a substantial distance from the test head without any appreciable loss in performance of the test circuit.

It has been found that transmission line lengths of ten feet can be used satisfactorily. The characteristic impedance can be in the 30–50 ohm range for the matching network 80 shown.

The current from current source (sink) 30 and current switch 36 are supplied to matching network 80 via the center conductor 76-1 of transmission line 76. The reference voltage (low or high) is supplied via the shield 76-2 of transmission line 76 and connected to node 92.

As current from current source (sink) 30 is switched on and off by current switch 36, current pulses are transmitted across transmission line 76. These current pulses are received by matching network 80 and thence provided to the emitter of transistor 84. In response thereto, corresponding pulses of current flow through the collector of transistor 84. Depending upon the voltage relationship between nodes 92 and 94, either diode 48 or diode 50 will be forward biased to permit current to flow into the collector of transistor 84. As discussed above, when the voltage at node 94 is below the voltage at node 92, diode 48 will be forward biased and current will flow from node 92 into the collector of transistor 84. Conversely, when the voltage of node 94 is above the voltage at node 92, diode 50 is forward biased and current will flow from node 94 into the collector of transistor 84. When nodes 92 and 94 are at the same voltage and when a current is present at the emitter of transistor 84, both diodes 48 and 50 will be forward biased and current will be permitted to flow into the collector of transistor 84 from nodes 92, 94 and/or the collector of transistor 100.

The structure illustrated in FIG. 4 permits a substantial reduction of the amount of power which is dissipated within the test head. This is because the components which remain within the test head dissipate only a small amount of power. For example, for a fixed magnitude of current as supplied by the current sources or sinks, the major sources of power dissipation are the collector-emitter of transistor 84 and transistor 100, and the pair of diodes in current diverter 42 which are in the conducting mode. As discussed above, the voltage drop across the collector-emitter of transistor 84 or 100, when conducting, will be one diode drop. Thus, for the portion of the driver circuitry in the left side of FIG. 4, the power dissipated will be approximately four diode drops times the current source (sink) current plus the current dissipated across resistors 88 and 102. This is to be contrasted with the power dissipation for the prior driver circuitry wherein the voltage drop across the collector-emitter of the current switches, i.e., 36 and 32, is in the tens of volts for the typical application.

For example, if in FIG. 3, $V_H$ were plus fifteen volts and $V_L$ were minus eleven volts, and if a current of 40 milliamps were supplied by the current sources (sinks), a power input of about one watt would be provided to each driver stage within the test head of the prior art, regardless of the low and high reference voltage levels. This is contrasted with the structure shown in FIG. 4, wherein the same $V_H$ and $V_L$ and current sources (sinks) levels are utilized. When, for example, the level of the test signals is chosen to be 8 volts, i.e. high reference voltage equals six volts, low reference voltage equals minus two volts, it can be shown that the total amount of power dissipated within the head for each driver circuit is approximately two-tenths of a watt. Thus, there is a factor of five difference between the power dissipated in the test head for the prior driver circuit configuration and that of the present invention.

The present invention also provides an improvement in the speed of the driver and load circuits. This is because the added current buffer stage and transmission line between the current diverter and the current switch tends to minimize the effect of the Miller capacitance which straddles the collector base junction of transistor in the current switch. In the driver and load circuits of prior art test heads single stage common-emitter amplifiers are used as the current switches. As such, the Miller capacitance is the collector to base capacitance multiplied by the gain of the stage. In turn this Miller capacitance tends to oppose the input signal to the stage applied at the base of the transistor. In the present invention, the current buffer acts to isolate the load, i.e. current diverter, from the collector of the current switch transistor. This acts to reduce the effect of the Miller capacitance.

Referring to FIG. 5a, the typical load circuitry of prior test heads is shown. It can be seen that this circuitry is similar to that used for the driver circuitry. As before, a current diverter 104 diverts current to or away from the electronic assembly under test depending upon the voltage of node 106 with respect to the voltage of node 108.

Transistor 110 and transistor 112 act as current switches to connect current sink 114 and current source 116, respectively, to current diverter 104. Resistors 118 and 120 are shown positioned in series with the current flow from current sink 114 and current source 116, respectively. Summation circuit 122 receives a current reference magnitude signal on line 124 from the control circuitry of the test system and compares this against the voltage obtained via line 126 from across resistor 118. This voltage is proportional to the amount of current flow through resistor 118. Summation circuit 122 then provides a control signal to current sink 114 via line 128 to cause the current flow through current sink 114 to correspond to the desired magnitude.

In a similar manner, summation circuit 130 receives information from the control circuitry regarding the magnitude of the desired load current via line 132, and monitors a magnitude of the current actually flowing through current source 116 by monitoring the voltage across resistor 120 via line 134.

Transistor 136 and transistor 138 are shown connected to act as an alternate current flow path for current source 116 and current source 114, respectively. Transistor 136 has an emitter which is tied to the junction of current source 116 and the emitter of transistor 112. When transistor 112 is commanded into an off condition by the control circuitry of the system, the current flowing from current source 116 will flow into the emitter of transistor 136. Similarly, the emitter of transistor 138 is connected to the junction between the emitter of transistor 110 and current sink 114, so that transistor 138 can provide a current path when the current switch, i.e. transistor 110, is commanded to an off position by the ATE.

As can be seen from FIG. 5a, transistors 110 and 138 will have a voltage across their collector emitter junctions which can be as large as $V_H$ for transistor 112, and $V_L$ for transistor 136. Similarly, transistors 110 and 138 can have a voltage across their collector emitter junctions which can be as large as $V_L$ for transistor 110, and $V_H$ for transistor 138. As such, when current from the current source (or sink) is flowing through each of the transistors, a significant amount of power can be dissipated in the transistor. This results in heat generation within the test head.

Referring to FIG. 5b, the load circuitry as structured according to the present invention is shown. There, the power dissipating components are positioned outside of the test head and within the main cabinet. The components of the load circuitry which remain in the test head dissipate only small amounts of power.

As with the driver circuitry of the present invention, the current switches 110 and 112 for the load circuitry of the present invention are coupled to the current diverter 104 by transmission lines 140 and 142. Current buffer means 144 and 146 couple the transmission lines 140 and 142 to current diverter 104. Additionally, the reference voltage for the load circuit is supplied via the shield of transmission lines 140 and 142, and connected to junction 108 of current diverter 104.

The transmission lines 140 and 142 interact with the current buffer stages 144 and 146 in a manner similar to that described in connection with the driver circuitry of the present invention discussed above.

Figure 6:
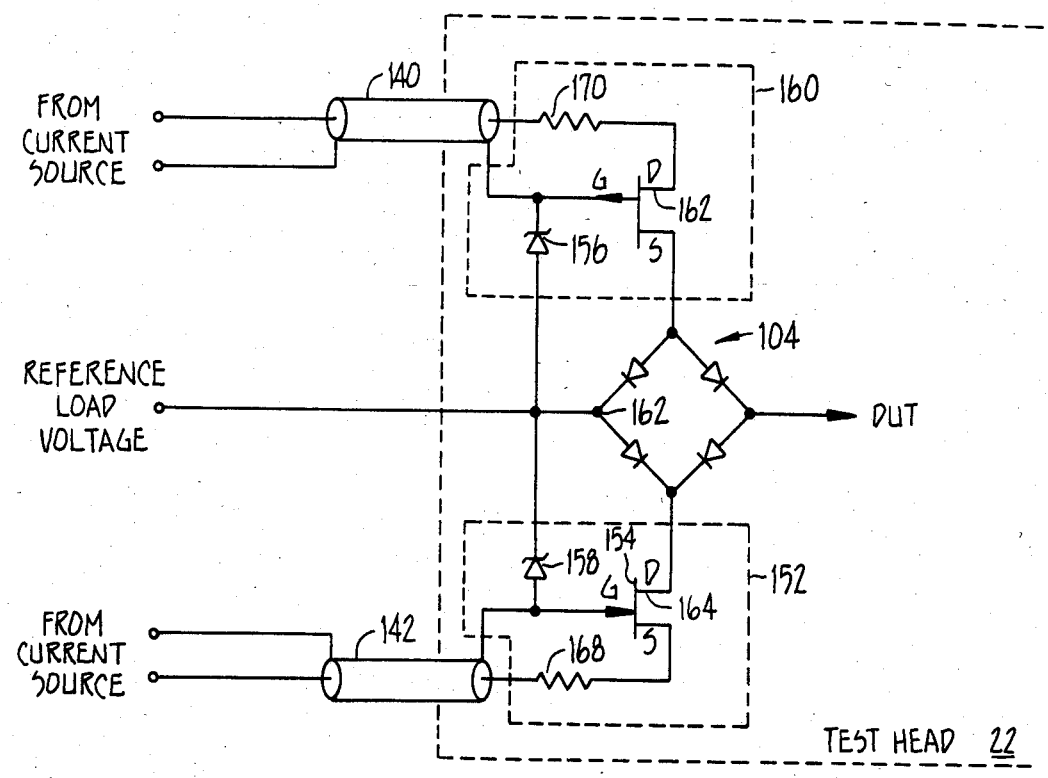
FIG. 6 illustrates an alternative embodiment of the current buffer portion of the present invention when low current levels are required.

FIG. 6 illustrates an alternate embodiment of the load circuitry implemented according to the present invention. This embodiment is useful when small load currents are required from the load circuit. In contrast to the current buffer circuits 146 and 144 of FIG. 5b, wherein bipolar transistors are utilized, the current buffer circuits 150 and 152 utilize field effect transistors (FETs) 162 and 164 and Zener diodes 156 and 158. Use of the FETs ensure that the current flowing into the current buffer will be the same as the current flowing out. This is because the current flow in the gate of the FET is negligible. Thus, the current supplied, via the current diverters 104, to the device under test will be the same as the current sensed by the current sensing circuitry, i.e., resistor 118, in the main cabinet.

The FET current buffer of FIG. 6 varies from the bipolar embodiment of FIG. 5 in that a gate-source input signal to FETs 162 and 164 are supplied between the shield and center conductor of transmission lines 140 and 142, respectively. As such, the load reference voltage is supplied on a separate line 166. Preferably, the impedance of transmission lines 140 and 142 are selected, given the voltage levels supplied by current switches 110 and 112, to provide a voltage to FETs 162 and 164 sufficient to turn them on. A characteristic impedance of 100 ohms has been found to be satisfactory. Preferably, the FETs used in the current buffers 152 and 160 are selected to have an "off" gate to source voltage which does not exceed −2 volts for N channel devices and +2 volts for P channel devices.

Resistors 166 and 170 are selected to match the characteristic impedance of the transmission lines to the input impedance of the FETs.

Zener diodes 156 and 158 are utilized between the gates of field effect transistors 152 and 160 and node 162 of the current diverter 104. The breakdown voltages of the Zener diodes are selected so that the FET will be biased for optimum speed when in a conducting mode.

By way of a comparative example between the prior test heads and test heads which are realizable when utilizing the structure of the present invention, reference is made to the following table. As can be seen from the table, two-thirds of the power formerly dissipated in prior test heads has been removed from the present test head. This reduction in dissipated power greatly reduces the need for any forced air cooling. Additionally, the component count for the driver/load circuitry corresponding to each pin or channel in the test head can be seen to have been reduced by one-third. All of the above translates to a reduction in the weight of the test head from 114 pounds to 35 pounds.

In turn, because the circuitry can now be spaced closer together due to the reduced cooling requirements, the maximum length of the connection between a test pin in the test head and the electrical assembly under test is approximately five inches. With such a length, as compared to the previous length of approximately 17 inches, the test head driver circuitry can easily achieve a drive frequency of 50 MHz. This is contrasted with the previous drive frequency upper limit of 20 to 40 MHz.

It is therefore clear that the driver and load circuit structures described in the present application make possible a test head which is smaller, lighter, faster and cooler than existing test heads in automatic test equipment systems.

TABLE

TEST HEAD - COMPARATIVE PARAMETERS FOR A 144 PIN TEST HEAD

| PARAMETER | PRESENT | PROPOSED |
|---|---|---|
| Size | 4,862 cubic inches | 1,000 cubic inches |
| Weight (without cable) | 114 lbs. | 35 lbs. |
| Power dissipation | 700 watts | 200 watts |
| Component count | 176/channel | 100/channel |
| Test pin spacing (Channel to channel) | 1.0 inches | 0.1 inches |
| Performance-electrical | Prior Art Specification | Same: No loss in performance |
| Lead length from test pin to pin under test | 17 inches | 5 inches |

The terms and expressions which have been employed here are used as terms of description and not of limitation, and there is no intention, in the use of such terms and expressions of excluding equivalents of the features shown and described, or portions thereof, it being recognized that various modifications are possible within the scope of the invention claimed.

We claim:

1. A method of configuring a system for automatically testing electronic assemblies wherein control means provide signals to control driver, load, and comparison circuitry, which circuitry supply test signals to and receive response signals from an electronic assembly under test and evaluate the received response signals, and further wherein the driver and load circuitry consume a first total amount of power, the method comprising the steps of a. positioning the control means in a main cabinet;
  b. partitioning the driver and load circuitry into a first portion which dissipates substantially all of the first total amount of power and a second portion which includes the remainder of the driver and load circuitry;
  c. positioning substantially all of the first portion of the driver and load circuitry in the main cabinet;
  d. positioning the remainder of the first portion and all of the second portion of the driver and load circuitry in a test head, wherein the test head supports the electronic assembly under test, couples the test signals to the electronic assembly under test, and receives the response signals from the electronic assembly under test; and
  e. coupling the second portion of the load and driver circuitry in the test head to the first portion of the load and driver circuitry in the main cabinet, whereby the amount of power dissipated in the test head is minimized.

2. The method of claim 1 wherein the driver and load circuitry include current sources, current switches and voltage controlled current diverters, and further wherein partitioning step "b" includes the steps of i. placing the current sources and current switches into the first portion of the driver and load circuitry; and
  ii. placing the voltage controlled current diverters in the second portion of the driver and load circuitry.

3. The method of claim 2 wherein step "b" further includes the step of iii. coupling the current sources and current switches to the second portion of the driver and load circuitry by way of a transmission line; and iv. coupling the transmission line to the voltage controlled current diverters by way of current-buffer stages.

4. An apparatus for testing electronic assemblies having a test head for supporting an electronic assembly under test and a main cabinet, wherein said apparatus supplies test signals to, applies loads to, and receives response signals from the electronic assembly under test, the apparatus comprising driver means for supplying the test signals wherein the driver means are organized into a first portion positioned in the main cabinet and a second portion positioned in the test head, the first portion including elements of the driver means which consume a substantial portion of the total power consumed by the driver means and the second portion including the remaining elements of the driver means;

load means for supplying the test signals and load to the electronic assembly under test;

comparison means for receiving and evaluating the response signals;

first means for coupling the driver means, the load means and the comparison means to the electronic assembly under test; and control means positioned in the main cabinet and coupled to the comparison means, the driver means and the load means for controlling said comparison means, driver means and load means.

5. The apparatus of claim 4, wherein the load means is organized into a first portion positioned in the main cabinet and a second portion positioned in the test head, the first portion including elements of the load means which consume a substantial portion of the total power consumed by the load means, and the second portion including the remaining elements in the load means.

6. The apparatus of claim 4 wherein the driver means include current and voltage source means positioned in the main cabinet for supplying a test current and test voltage which are representative of the test signal;

current buffer means positioned in the test head for receiving the test current from the current and voltage source means;

means responsive to the test voltage from the current and voltage source means and coupled to the current buffer means and to the electronic assembly under test, for diverting current flow between the current buffer means and the electronic assembly under test so that the voltage level applied by the driver means to the electronic assembly under test corresponds to the test voltage; and second means for coupling the test voltage and test current to the diverting means and the current buffer means respectively.

7. The apparatus of claim 6 wherein the second coupling means includes transmission line means having a characteristic impedance for coupling the test voltage and test current to the diverting means and current buffer means.

8. The apparatus of claim 7 wherein the current buffer means includes common base amplifier means having an output which is connected to the diverting means and an input, for amplifying signals received from the transmission line means; and means for coupling the transmission line means to the input of the common base amplifier means and for matching the characteristic impedance of the transmission line means to the input of the common base amplifier means, wherein the common base amplifier means is operated between the fully off condition and a nonsaturated on condition.

9. The apparatus of claim 6 wherein the diverting means is a diode bridge having first and second pairs of opposing nodes in which the test voltage is coupled to one node of the first pair of opposing nodes and the electronic assembly under test is coupled to the other node of the first pair of opposing nodes, and the current buffer means are coupled to the nodes of the second pair of opposing nodes whereby current is diverted to or away from the electronic assembly under test when the nodes of the first pair of opposing nodes are at different voltage levels.

10. The apparatus of claim 8 wherein the common base amplifier means include transistor means having an emitter, a collector and a base; and diode means connected to receive the test voltage from the second coupling means and to the base of the transistor means to prevent the saturation of the transistor means, wherein the matching and coupling means are connected between the base and emitter of the transistor means and the collector of the transistor means is the output of the common base amplifier means.

11. The apparatus of claim 7 wherein the current buffer means include field effect transistor amplifier means having an output coupled to the diverting means and an input for amplifying signals received from the transmission line means; and third means for coupling the transmission line means to the input of the field effect transistor amplifier means and for matching the characteristic impedance of the transmission line means to the input of the field effect transistor amplifier means, wherein the field efect transistor amplifier means is operated between a fully off condition and an on condition which is optimized for speed.

12. The apparatus of claim 11 wherein the field effect transistor amplifier means include a field effect transistor having a drain, source and gate, wherein the third coupling means couple the transmission line means across the gate and drain, and the diverter means are connected to the source; and means for biasing the field efect transistor to optimize the speed thereof.

* * * * *